United States Patent
Carroll et al.

(10) Patent No.: US 10,397,663 B2
(45) Date of Patent: *Aug. 27, 2019

(54) SYNCHRONIZING ANCILLARY DATA TO CONTENT INCLUDING AUDIO

(71) Applicant: Source Digital, Inc., Barto, PA (US)

(72) Inventors: Timothy J. Carroll, Lancaster, PA (US); Henry Lawrence Frecon, III, Barto, PA (US); Patrick Clay Greene, Van Nuys, CA (US); Michael Eric Phillips, Melrose, MA (US)

(73) Assignee: Source Digital, Inc., Barto, PA (US)

( * ) Notice: Subject to any disclaimer, the term of this patent is extended or adjusted under 35 U.S.C. 154(b) by 41 days.

This patent is subject to a terminal disclaimer.

(21) Appl. No.: 15/094,538

(22) Filed: Apr. 8, 2016

(65) Prior Publication Data
US 2017/0295412 A1    Oct. 12, 2017

(51) Int. Cl.
| | |
|---|---|
| *H04N 7/173* | (2011.01) |
| *H04N 21/845* | (2011.01) |
| *G06F 3/16* | (2006.01) |
| *H04N 21/858* | (2011.01) |
| *H03G 7/00* | (2006.01) |
| *H04N 21/231* | (2011.01) |
| *H04N 21/233* | (2011.01) |
| *H04N 21/234* | (2011.01) |

(Continued)

(52) U.S. Cl.
CPC ........... *H04N 21/845* (2013.01); *G06F 3/165* (2013.01); *H03G 7/002* (2013.01); *H03G 7/007* (2013.01); *H04N 21/231* (2013.01); *H04N 21/233* (2013.01); *H04N 21/234* (2013.01); *H04N 21/242* (2013.01); *H04N 21/42203* (2013.01); *H04N 21/433* (2013.01); *H04N 21/4307* (2013.01); *H04N 21/4394* (2013.01); *H04N 21/44008* (2013.01); *H04N 21/4722* (2013.01); *H04N 21/8586* (2013.01); *H04N 21/812* (2013.01)

(58) Field of Classification Search
CPC . H04N 21/85; H04N 21/8545; H04N 21/8547
See application file for complete search history.

(56) References Cited

U.S. PATENT DOCUMENTS

| | | |
|---|---|---|
| 5,874,955 A | 2/1999 | Rogowitz et al. |
| 9,275,427 B1 | 3/2016 | Sharifi |

(Continued)

FOREIGN PATENT DOCUMENTS

WO    03000091990 A1    11/2003

OTHER PUBLICATIONS

International Search Report for Corresponding Patent Application No. PCT/IB2017/052033, dated Jun. 9, 2017.

(Continued)

*Primary Examiner* — Olugbenga O Idowu
(74) *Attorney, Agent, or Firm* — Renner, Otto, Boisselle & Sklar, LLP

(57) ABSTRACT

Synchronizing ancillary data to content including audio includes obtaining a representation of the content's audio and ancillary data pegged to instants in the representation of the content's audio, and aligning the representation of the content's audio to the content's audio to synchronize the ancillary data pegged to the instants in the representation of the content's audio to the content.

40 Claims, 8 Drawing Sheets

(51) Int. Cl.
*H04N 21/242* (2011.01)
*H04N 21/43* (2011.01)
*H04N 21/433* (2011.01)
*H04N 21/439* (2011.01)
*H04N 21/44* (2011.01)
*H04N 21/422* (2011.01)
*H04N 21/4722* (2011.01)
*H04N 21/81* (2011.01)

(56) References Cited

U.S. PATENT DOCUMENTS

| | | |
|---|---|---|
| 9,374,374 B2 | 6/2016 | Steinberg et al. |
| 2002/0056136 A1 | 5/2002 | Wistendahl |
| 2011/0016172 A1 | 1/2011 | Shah |
| 2011/0063503 A1 | 3/2011 | Brand et al. |
| 2011/0321114 A1 | 12/2011 | Newell |
| 2012/0215329 A1 | 8/2012 | Jiang |
| 2013/0151970 A1 | 6/2013 | Achour |
| 2013/0160038 A1 | 6/2013 | Slaney et al. |
| 2013/0178966 A1 | 7/2013 | Magnusso |
| 2013/0259211 A1 | 10/2013 | Vlack |
| 2014/0310006 A1 | 10/2014 | Anguera Miro |
| 2014/0359079 A1 | 12/2014 | Weill |
| 2015/0045920 A1 | 2/2015 | Liu |
| 2015/0110457 A1 | 4/2015 | Abecassis et al. |
| 2015/0189347 A1 | 7/2015 | Oztaskent et al. |
| 2015/0287416 A1 | 10/2015 | Brands |
| 2015/0294368 A1 | 10/2015 | Russell et al. |
| 2015/0319506 A1* | 11/2015 | Kansara ............ H04N 21/4307 725/32 |
| 2016/0021421 A1 | 1/2016 | Panger |
| 2016/0249115 A1 | 8/2016 | Lincke |

OTHER PUBLICATIONS

International Search Report for Corresponding Patent Application No. PCT/IB2017/052031, dated Jun. 16, 2017.
Anonymous, "Automated Content Recognition—creating content aware ecosystems", CSI Magazine, dated Sep. 2012, pp. 1-16, XP055380079, England.
Shumeet Baluja et al, "Audio Fingerprinting: Combining Computer Vision & Data Stream Processing", IEEE International Conference on Acoustics, Speech and Signal Proessing (ICASSP), Honolulu, Hawaii, USA, dated Apr. 2007, pp. 11-213, XP055380185.

* cited by examiner

SYNCHRONIZING ANCILLARY DATA TO CONTENT INCLUDING AUDIO

BACKGROUND

Media content is produced, processed, and then transmitted to consumers. In addition to traditional media content, the proliferation of electronic communications technologies has allowed for mass delivery of ancillary data related to or enhancing the content. For example, technologies such as instant messaging provide a medium by which to deliver electronic information to a large number of people very quickly. Electronic devices including, for example, personal computers, mobile phones, personal digital assistants, smart phones, and television set-top boxes (e.g., cable set top boxes, satellite set top boxes, etc.), provide ready access to consumers of information. The type and content of ancillary data that may be delivered via modern communication technologies varies greatly and comprises everything from personal information to advertisement. Ancillary data can take on various forms from simple text, to graphics, to video, to content containing numerous layers of data.

But current technologies are deficient in extracting such ancillary data for subsequent processing. Current methods of synchronization of content and ancillary data, for example, may require an explicit data connection between the source and the target or consumer and are often unidirectional. Other current methods of synchronization may rely on metadata which may or may not be present all the way through the signal chain as different facilities will use various workflows which may or may not support metadata.

SUMMARY OF THE INVENTION

The present disclosure provides methods and systems to address these problems. The present disclosure describes a dynamic combination of audio, metadata fingerprinting and explicit metadata to trigger actions in the pipeline carrying content from production to consumers. These actions selectively preserve the original content and quality, ensure compliance and acceptable integration of unknown content, provide a path for conditional access to the upstream database, as well as a return path. The invention disclosed herein uses a dual path for ancillary data synchronization, enabling indirect connectivity and bypassing data roadblocks. Adding local fingerprinting to compare live events and those stored in a database enables the chain to be bypassed if and when metadata is not available, and provides a mechanism for feedback of data to indicate synchronization as well as provide updates and additional new information to the database. It provides a way to store and retrieve time-aligned feature-rich data about the content which can be used for quality preservation, e-commerce, and finely grained audience measurement.

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Figure 1:
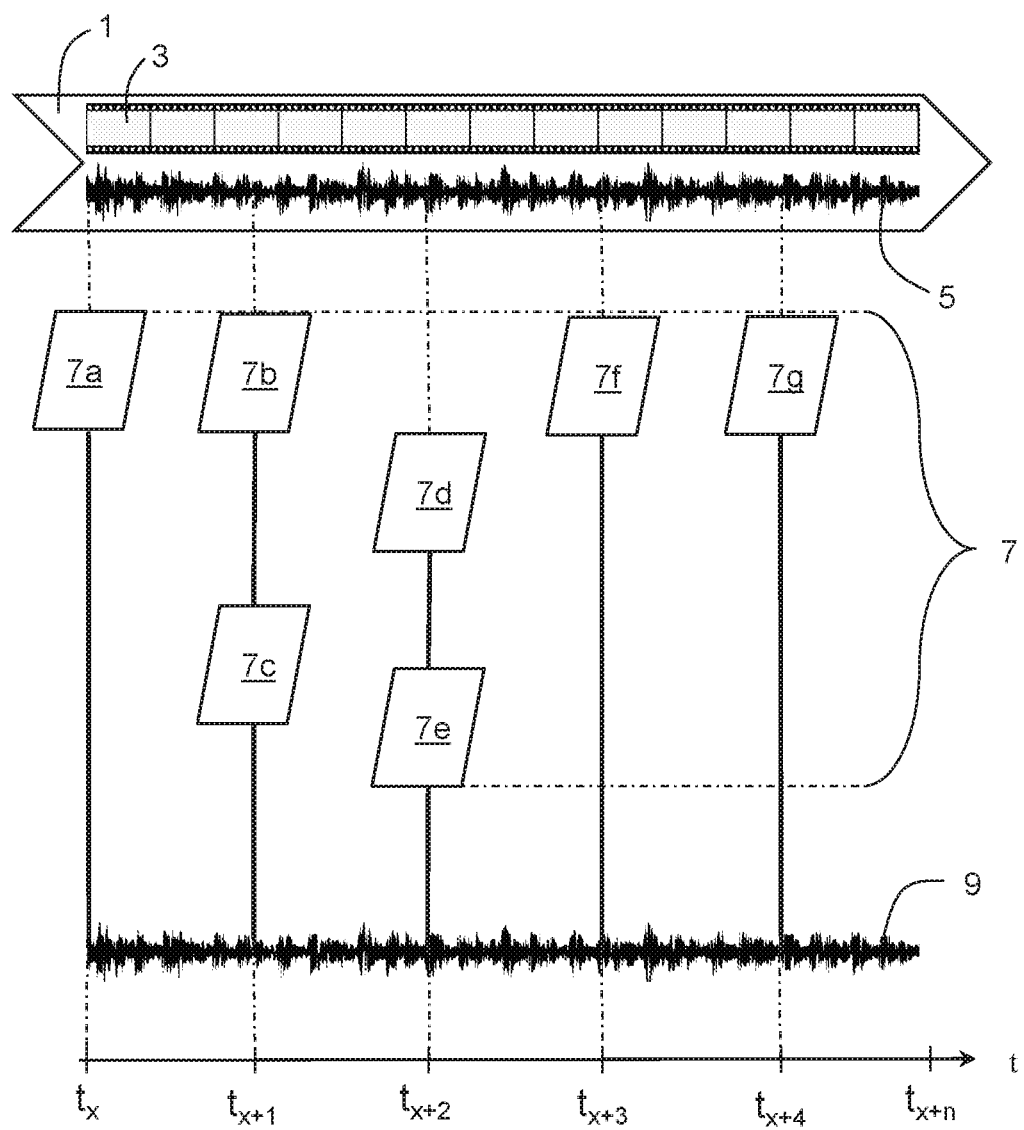
FIG. 1 illustrates a schematic diagram of an exemplary method for synchronizing ancillary data to content including audio.

FIG. 1 illustrates a schematic diagram of an exemplary method for synchronizing ancillary data to content including audio. FIG. 1 shows a content 1, which, in the illustrated embodiment, includes video 3 and audio 5. The content 1 may be a movie, a TV show, a sports event (e.g., basketball game), Internet video, etc.

FIG. 1 also shows ancillary data 7. The ancillary data 7 is data that is somehow related to the content and may include data describing the content such as content name or content identification data, data about a script played out in the content, data about wardrobe wore by characters in the content, data including comments from performers, producers, or directors of the content, an Uniform Resource Locator (URL) to a resource that includes information about the content, data about music in the audio of the content, etc. Ancillary data 7 may include commercial data such as advertisement data. Ancillary data 7 may also include user data such as comments from viewers of the content (e.g., twitter messages, etc.) Ancillary data 7 may also include professional or technical data such as statistics of the content's audio including, for example, loudness or dynamic range scaling of the content's audio, etc.

As can be seen from the above examples, what constitutes ancillary data 7 may vary widely and may be collected from many different sources. For purposes of this disclosure, however, the nature of the ancillary data 7 is perhaps not as important as the timing of the ancillary data 7 relative to the content 1.

In the illustrated embodiment of FIG. 1, ancillary data 7a is aligned to (i.e., it appears at or relates to) a time $t_x$ of the content 1. Ancillary data 7b and 7c appear at or relate to a time $t_{x+1}$ of the content 1. Ancillary data 7d and 7e appear at or relate to time $t_{x+2}$. Ancillary data 7f appears at or relates to time $t_{x+3}$ of the content 1 and ancillary data 7g appears at or relates to time $t_{x+4}$.

For example, ancillary data 7a at $t_x$ may indicate the content's name, True Blood, season 2, episode 2. At time $t_{x+1}$ (e.g., at 12 m 2 s) ancillary data 7b describes that Sookie Stackhouse, played by Anna Paquin is wearing Manolo Blahnik Hangisi 105 satin pump shoes while ancillary data 7c indicates that the music is Beethoven's Moonlight Sonata performed by the London Symphony Orchestra. Ancillary data 7d and 7e may be twitter messages received at time $t_{x+2}$ in which users express their reactions to the content 1 or a particularly scene in the content 1. Ancillary data 7f may indicate a change at $t_{x+3}$ in the prescribed loudness or dynamic range scaling of the content's audio due to a commercial break. Ancillary data 7g may indicate a change at $t_{x+4}$ in the prescribed loudness or dynamic range scaling of the content's audio due to a return to the content 1 from the commercial break.

Thus, the ancillary data 7 is time-aligned to the content 1.

Regarding authorship or collection, ancillary data 7 may be obtained or collected prior to playout, broadcast, distribution or performance of the content 1. For example, ancillary data 7 may be obtained or collected during production, editing, quality control, or mastering of the content 1. Ancillary data 7 may also be obtained or collected during playout, broadcast, distribution or performance of the content 1. For example, if the content 1 is a TV show, ancillary data 7 may be obtained or collected during a first or subsequent broadcast of the TV show.

Regarding storage and distribution, ancillary data 7 collected may be stored in a database that may be made accessible to future users or viewers of the content 1. This way, when the content 1 is later distributed to those users or viewers, the ancillary data 7 may be available to those users or viewers for consumption at the same time as the content 1. The ancillary data 7 appears or manifests itself aligned in time to the content 1.

A significant issue that arises is synchronization; as a practical matter, how exactly is the ancillary data 7 time-aligned to the content 1. Current methods of synchronization of content and ancillary data require an explicit data connection between the content's source and the target or consumer. This explicit timing data communicates the timing to equipment at the consumer premises. These methods are also usually unidirectional from the source or content provider to the target or consumer, which is a limitation. Other current methods of synchronization rely on metadata attached to the content, which may or may not be present all the way through the signal chain from the source or content provider to the target or consumer since different facilities will use various workflows which may or may not support metadata.

As shown in FIG. 1, the content 1 includes video 3 and audio 5. FIG. 1 also illustrates a representation 9 of the audio 5 of the content 1 in the form of an audio waveform signature. The representation 9 matches the audio 5 of the content 1 at least to the extent that the audio 5 is identifiable from the representation 9 along the time t. In the embodiment of FIG. 1, the ancillary data 7 are each pegged to the representation 9 at instants of the representation 9 corresponding to the instants of the audio 5 to which the ancillary data 7 is aligned.

In the example of FIG. 1, ancillary data A is pegged to the instant of representation 9 corresponding to time $t_x$ of the content 1. Ancillary data 7b and 7c are pegged to the instant of representation 9 corresponding to time $t_{x+1}$ of the content 1. Ancillary data 7d and 7e are pegged to the instant of representation 9 corresponding to time $t_{x+2}$. Ancillary data 7f is pegged to the instant of representation 9 corresponding to time $t_{x+3}$ of the content 1 and ancillary data 7g is pegged to the instant of representation 9 corresponding to time $t_{x+4}$ of the content 1.

Each of the ancillary data 7 and the representation 9 may then be stored in a database that may be made accessible to future users or viewers of the content 1. This way, when the content 1 is distributed to those users or viewers, the representation 9 as well as the ancillary data 7 pegged to the representation 9 may be available to those users or viewers.

At the user's premises, the audio 5 of the content 1 being received may be compared real-time to the representation 9 to synchronize the audio 5 and hence the content 1 to the representation 9. Moreover, since the ancillary data 7 is pegged to the instants of the representation 9 corresponding to their respective times of the content 1, the ancillary data 7 may be synchronized to the content 1 even in the absence of explicit timing data.

Figure 2:
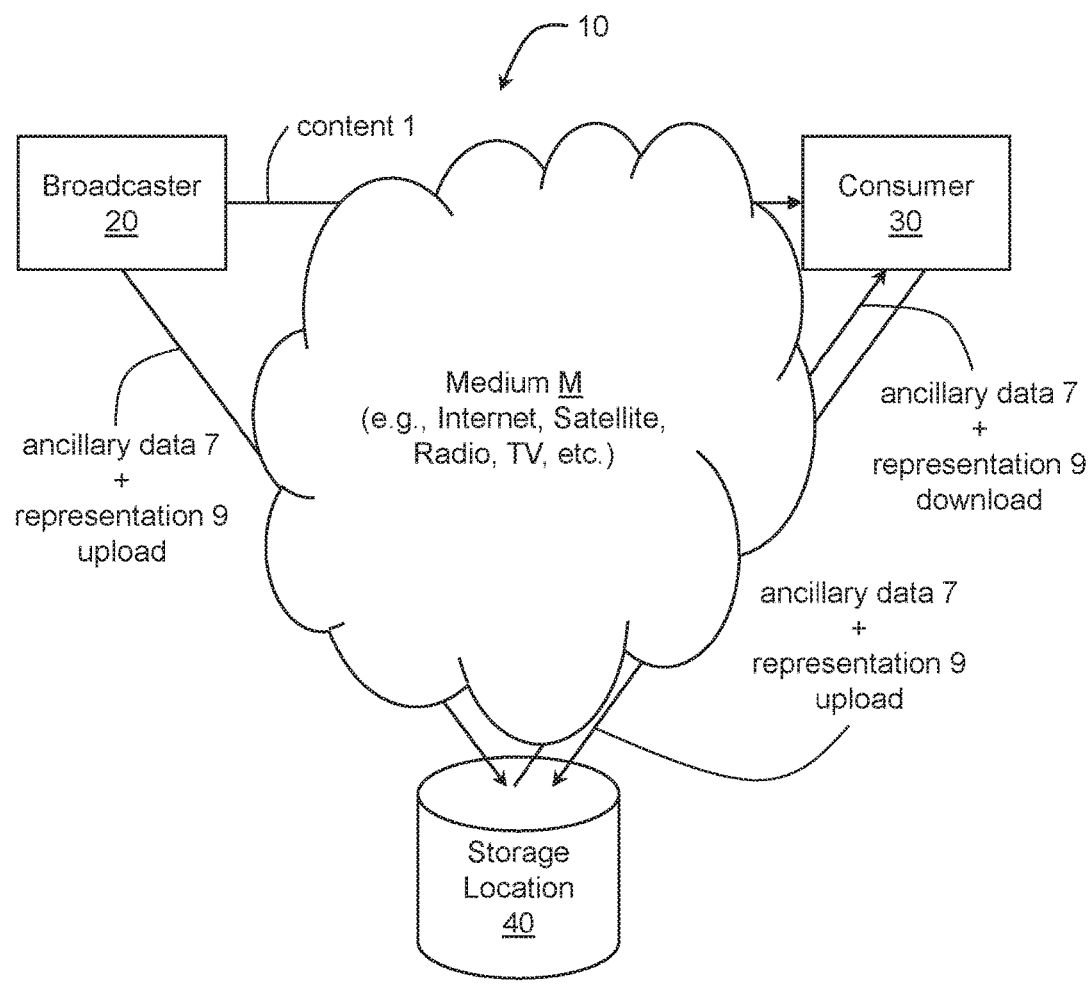
FIG. 2 illustrates a block diagram of an exemplary system for synchronizing ancillary data to content including audio.

FIG. 2 illustrates a block diagram of an exemplary system 10 for synchronizing ancillary data to content including audio. The system 10 includes three major components: the broadcaster 20, the consumer 30, and the storage location 40. FIG. 2 also shows the medium M through which the broadcaster 20, the consumer 30, and the storage location 40 communicate with each other.

Although for ease of explanation the present disclosure refers to the element 20 as the broadcaster 20, the element 20 is not limited to broadcasters or broadcasting facilities or equipment. In practice, the broadcaster 20 may represent any facility or equipment such as production, editing, quality control, or mastering equipment that touches the content 1 prior to and during playout for transmission or broadcasting.

Similarly, although for ease of explanation the present disclosure refers to the element 30 as the consumer 30, the element 30 is not limited to consumers or consumer premises or equipment. In practice, the consumer 30 may represent any premise or equipment that touches the content 1 during or post playout for transmission or broadcasting.

Also, the medium M may be any medium used to transmit content 1 or data generally such as, for example, the Internet, satellite communication, radio communication, television communication (broadcast or cable), etc. Although in the figures the medium M is shown as being shared by the broadcaster 20, the consumer 30, and the storage location 40, communication between these elements does not need to take place in the same medium. So, for example, the broadcaster 20 may communicate with the consumer 30 via satellite while the broadcaster 20 communicates to the storage location 40 via the Internet.

In the example of FIG. 2, the broadcaster 20 transmits the content 1 to the consumer 30 and the ancillary data 7 and the representation 9 to the storage location 40 for storage. The consumer 30 receives the content 1 from the broadcaster 20 and the ancillary data 7 and the representation 9 from the storage location 40. Interestingly, the consumer 30 may also transmit ancillary data 7 and/or representation 9 to the storage location 40. Thus, the system 10 provides bidirectional communication by the consumer 30; the consumer 30 may participate in the creation of ancillary data 7, enhancing the ancillary data 7, the system's functionality and, ultimately, the customer's experience.

Figure 3:
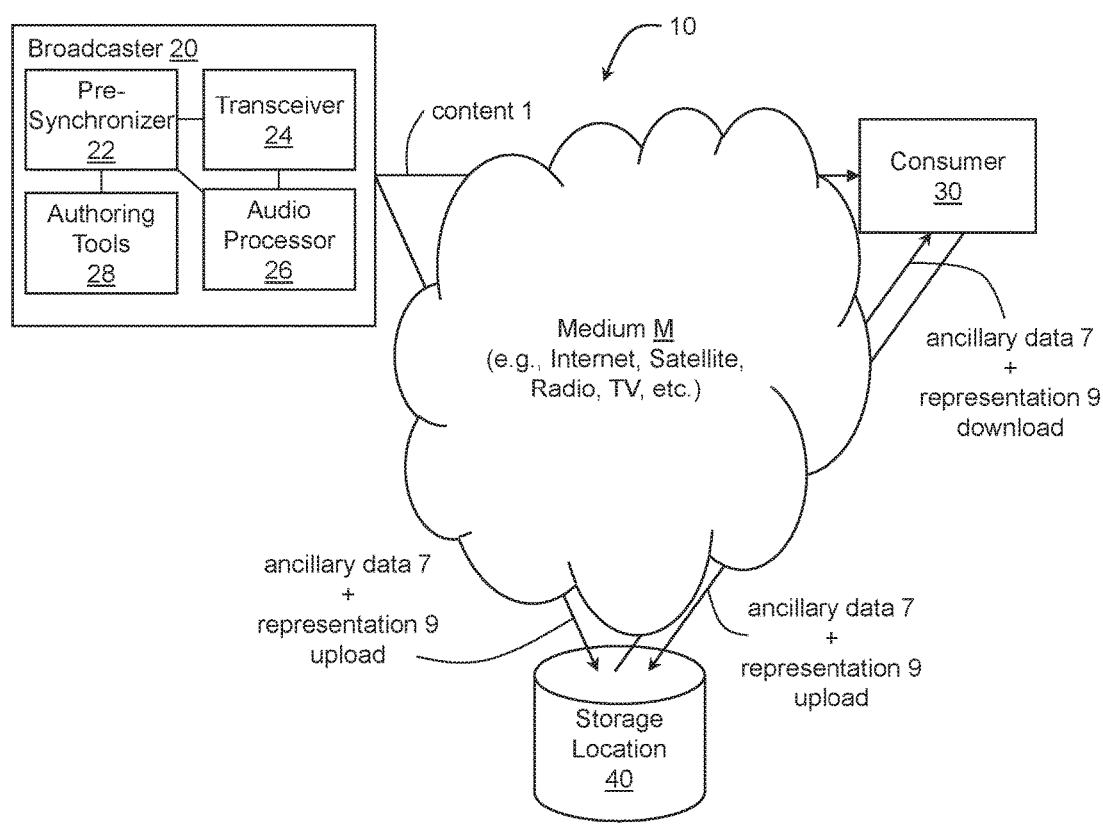
FIG. 3 illustrates a block diagram of the exemplary system including details at the broadcaster.

FIG. 3 illustrates a block diagram of the exemplary system 10 including details at the broadcaster 20. The broadcaster 20 includes a machine or group of machines for synchronizing ancillary data to content including audio. In the illustrated embodiment, the broadcaster 20 includes a pre-synchronizer 22 that pegs the ancillary data 7 to instants of the representation 9 (i.e., the representation of the audio 5 of the content 1 of FIG. 1).

The broadcaster 20 may also include a transceiver 24 that communicates the content 1 to the consumer 30 and the representation 9 and the ancillary data 7 pegged to the instants in the representation 9 to the storage location 40 via the medium M. As described above, the storage location 40 is accessible by consumer 30. Alignment of the representation 9 to the content's audio 5 upon subsequent playout, broadcast, distribution, performance, etc. of the content 1 synchronizes the ancillary data 7 pegged to the instants in representation 9 to the content 1.

The broadcaster 20 may also include an audio processor 26, which may process the audio 5 of the content 1 to create a representation of the content's audio 5 such as, for example, the audio waveform signature of FIG. 1. The transceiver 24 may then communicate the representation 9 of the content's audio 5 (e.g., the signature) and the ancillary data 7 pegged to the instants in the representation of the content's audio to the storage location 40.

In one embodiment, the pre-synchronizer 22 creates a link to the storage location 40. The link may be a Uniform Resource Identifier (e.g., URL) or similar location identifier or locator. The audio processor 26 may insert the link to the storage location 40 into metadata of the content 1 or specifically metadata of the content's audio 5. The audio 5 may be encoded as Dolby AC-4, AC-3 or E-AC-3 or MPEG-H, all of which can carry metadata. The consumer 30 may extract the link to the storage location 40 from the metadata of the content 1 or of the content's audio 5. Having the link to the storage location 40, the consumer 30 may then communicate to the storage location 40 to obtain the information stored in the storage location 40 or to store information therein.

In one embodiment, the audio processor 26 analyzes the content's audio 5 to collect statistics of the audio 5 including, for example, loudness or dynamic range scaling of the audio 5. The audio processor 26 may insert the statistics of the content's audio 5 into metadata of the content 1 or of the content's audio 5. The consumer 30 may extract the statistics of the content's audio 5 from the metadata.

In one embodiment, the transceiver 24 communicates the statistics of the content's audio 5 to the storage location 40 in addition to the representation 9 of the content's audio, and the ancillary data 7 pegged to the instants in the representation 9 of the content's audio. The consumer 30 may obtain the statistics of the content's audio 5 from the storage location 40.

Having the statistics of the content's audio 5, the consumer 30 may then adjust audio to be played at or distributed from the consumer 30 premises based on the statistics of the content's audio 5 extracted from the metadata.

As discussed above, the pre-synchronizer 22 may collect the ancillary data 7 during a previous playout or performance of the content 1. For example, the content 1 may be a basketball game which is originally broadcasted live. Ancillary data 7 may include up-to-date game statistics (e.g., points, rebounds, assists, etc.) Having access to this ancillary data 7 and its corresponding timing, the pre-synchronizer 22 may peg the ancillary data 7 to instants in a representation 9 (e.g., a waveform signature) of the game's audio 5 corresponding to the appropriate timing in the game when the statistics are accurate. The transceiver 24 may then transmit the ancillary data 7 and the representation 9 to the storage location 40 for the consumer 30 to have access to the information to use as described above.

The broadcaster 20 may also include authoring tools 28 to collect ancillary data 7. The authoring tools 28 may allow, for example, a statistician to enter the statistics of the basketball game described above. In general, the authoring tools 28 may allow entry of ancillary data 7. The authoring tools 28 may be used to enter ancillary data describing the content such as content name or content identification data, data about a script played out in the content, data about wardrobe wore by characters in the content, data including comments from performers, producers, or directors of the content, an Uniform Resource Locator (URL) to a resource that includes information about the content, data about music in the audio of the content, etc. The authoring tools 28 may also be used to enter ancillary data 7 in the form of commercial data such as advertisement data or professional or technical data regarding or relating to the content.

Figure 4:
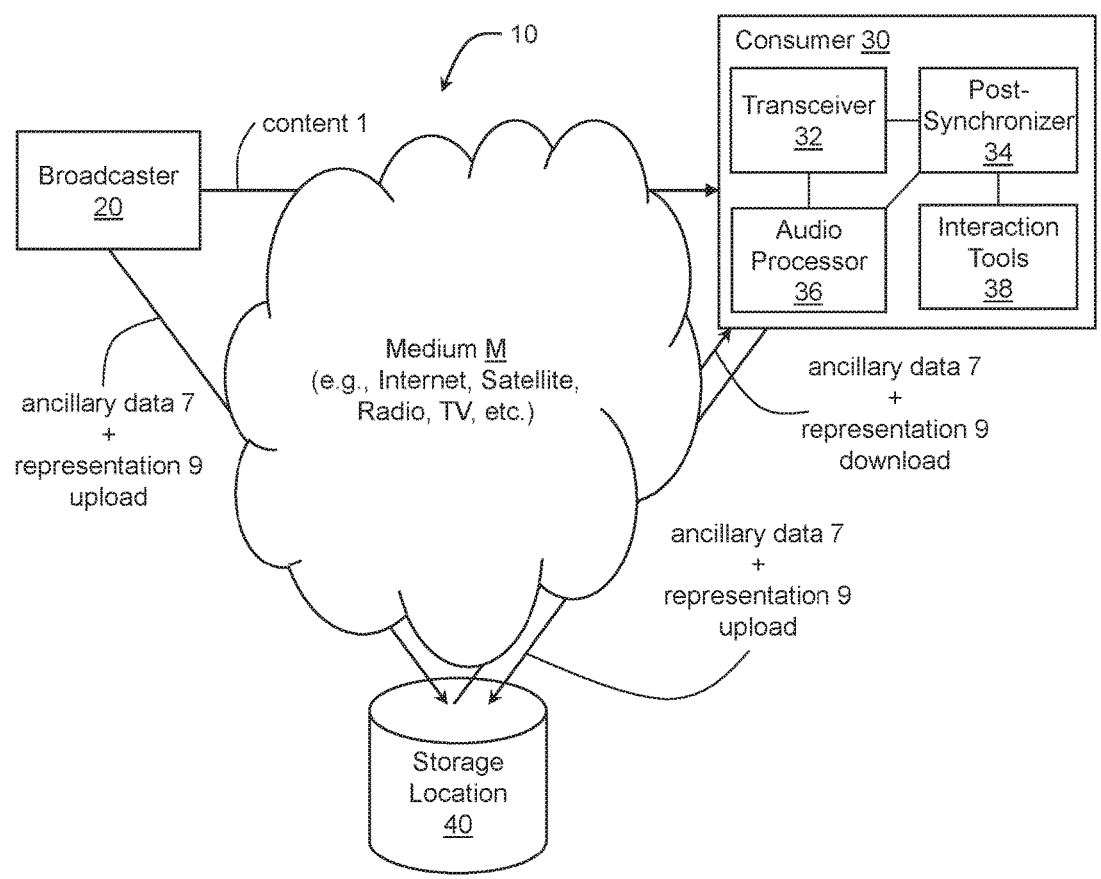
FIG. 4 illustrates a block diagram of the exemplary system including details at the consumer.

FIG. 4 illustrates a block diagram of the exemplary system 10 including details at the consumer 30. The consumer 30 may include a machine or group of machines for synchronizing ancillary data 7 to content 1 including audio 5.

In the illustrated embodiment, the consumer 30 includes a transceiver 32 that receives the content 1 from the broadcaster 20 and the representation 9 of the content's audio 5 and the ancillary data 7 pegged to instants in the representation 9 of the content's audio 5 from the storage location 40.

The consumer 30 may also include a post-synchronizer 34 that aligns the representation 9 of the content's audio to the content's audio 5 thereby synchronizing the ancillary data 7 to the content 1 as described above. The specific methodology by which the post-synchronizer 34 aligns the representation 9 of the content's audio to the content's audio 5 is not crucial to the present invention. Mechanisms by which such alignment may be accomplished include a variation of what is known as Automatic Content Recognition (ACR) and specifically a variation of what is known as fingerprinting. ACR are technologies used to identify or recognize content played on a media device or present in a media file. Acoustic fingerprinting generates unique fingerprints from the content itself. Fingerprinting techniques work regardless of content format, codec, bitrate and compression techniques. This makes it possible to use across networks and channels. Continuously comparing an ongoing, real-time fingerprint of the content 1 to the representation 9 may be used to synchronize the ancillary data 7 timeline of the content 1.

The consumer 30 may also include an audio processor 36 that receives the content's audio 5 from the transceiver 32. In one embodiment, the audio processor 36 may extract metadata from the content 1 or from the content's audio 5 and, from the metadata, the audio processor may extract the link to the storage location 40 as described above. Having the link to the storage location 40, the transceiver 32 may then communicate to the storage location 40 to obtain the information stored in the storage location 40 or to store information therein.

Alternatively or in addition, the link to the storage location 40 may be distributed to the consumer 30 in a subscription basis or otherwise provided to the consumer 30. This way, if the content 1 as received by the consumer 30 does not include metadata or the metadata does not include the link to the storage location 40, the consumer 30 may still access the storage location 40.

In one embodiment, the audio processor 36 extracts statistics of the content's audio 5 (e.g., loudness or dynamic range scaling) stored in the metadata as described above instead of or in addition to extracting the link to the storage location 40. In one embodiment, the transceiver 32 receives the statistics of the content's audio 5 from the storage location 40 in addition to the representation 9 of the content's audio, and the ancillary data 7. Having the statistics of the content's audio 5, the audio processor 36 may then process audio to be played at or distributed from the consumer 30 premises based on the statistics of the content's audio 5 obtained from the storage location 40.

In one embodiment, when the content 1 or the content's audio 5 includes metadata, the audio processor processes audio to be played at or distributed from the consumer 30 premises using the statistics of the content's audio (e.g., loudness or dynamic range scaling) stored in the metadata.

On the other hand, when the content 1 or the content's audio 5 does not include metadata, the audio processor 36 processes audio to be played at or distributed from the consumer 30 premises using the statistics of the content's audio 5 stored at the storage location 40.

In one embodiment, the audio processor 36 compares the content's audio 5 to the representation 9 of the content's audio 5 obtained from the storage location 40. Based on that comparison, the content 1 may be identified. That is, if the content's audio 5 and the representation 9 of the content's audio match within a set of parameters, the content 1 may be identified as corresponding to the representation 9 or vice versa. Similarly, if the content's audio 5 and the representation 9 of the content's audio do not match within the set of parameters, the content 1 may be said to not correspond to the representation 9 or vice versa. U.S. patent application Ser. No. 14/699,658 filed on Apr. 29, 2015 incorporated here by reference discloses systems and methods for authenticating content via loudness signature. The systems and methods disclosed therein may be used for identification of the content 1. Other systems and methods different from those disclosed in the '658 application may also be used for identification of the content 1.

The consumer 30 may also include interaction tools 38 that present (e.g., display) the ancillary data 7 in synchronicity with presentation of the content 1. The interaction tools 38 present the ancillary data 7 in synchronicity with presentation of the content 1 by relying on the aligning of the representation 9 of the content's audio to the content's audio 5. This aligning synchronizes the ancillary data 7, which is pegged to the instants in the representation 9 of the content's audio, to the content 1. In the basketball game example described above, the interaction tools 38 may display the up-to-date statistics of the basketball game in synchronicity with presentation of the game even when the game is replayed many years after the game was first televised live.

Because the storage location 40 stores the ancillary data 7 and the representation 9 of the content's audio 5, the information may be available for access at any time. For example, the consumer 30 may have recorded the basketball game (i.e., the content 1) in a digital video recorder (DVR) or obtain a recording of the game in any other way. A few days later the consumer may watch the game. The transceiver 32 may obtain the game (i.e., the content 1) from the DVR (or any other way the consumer 30 obtained the content) and may also obtain the representation 9 and the ancillary data 7 from the storage location 40. The interaction tools 30 may then display the up-to-date statistics of the basketball game in synchronicity with presentation of the game, even when the game is replayed after the game was first televised live.

In one embodiment, the interaction tools 38 may also be used to collect ancillary data 7. For example, during a playout, broadcast, distribution or performance of the content 1, the consumer may enter, via the interaction tools 38, ancillary data 7 such as notes or comments relating to the content 1 or specific scenes or portions of the content 1. The post-synchronizer 34 may then peg the ancillary data 7 entered via the interaction tools 38 to instants of the representation 9 of the content's audio corresponding to instants in the content 1 and store the ancillary data 7 to the storage location 40. In this case the representation 9 may be a) a representation obtained from the storage location 40 or b) a representation created locally at the consumer 30 by the audio processor 36 and stored to the storage location 40 with the ancillary data 7.

Figure 5:
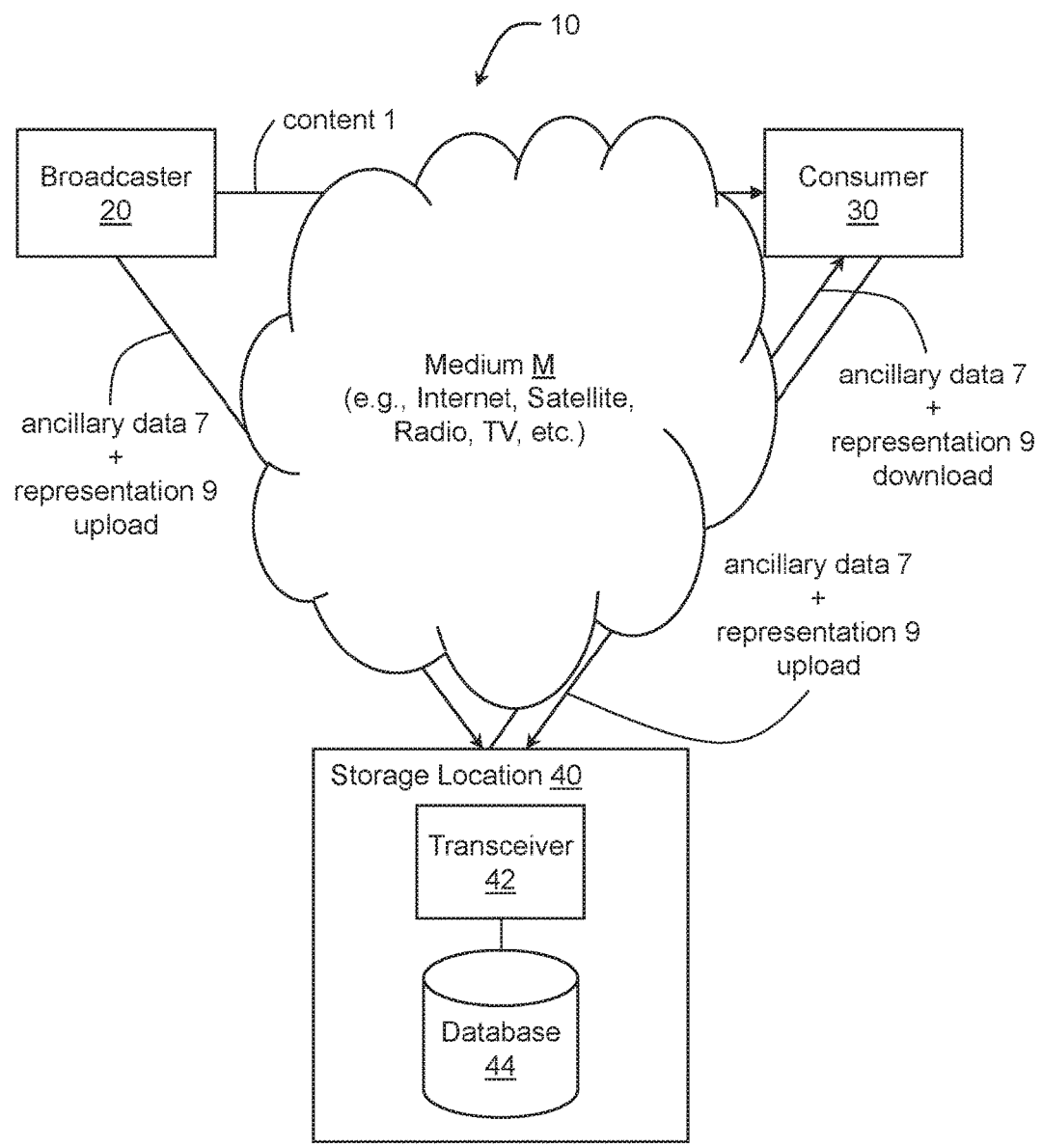
FIG. 5 illustrates a block diagram of the exemplary system including details at the storage location.

FIG. 5 illustrates a block diagram of the exemplary system 10 including details at the storage location 40. The storage location 40 may include a machine or group of machines for synchronizing ancillary data to content including audio. The storage location 40 may include a transceiver 42 that communicates (i.e., transmits and receives) the representation 9 of the content's audio and the ancillary data 7. The storage location 40 may also include a database 44 that stores the representation 9 of the content's audio and the ancillary data 7 pegged to instants in the representation 9 of the content's audio.

In one embodiment, the transceiver 42 communicates and the database 44 stores statistics of the content's audio 5 (e.g., loudness or dynamic range scaling) as ancillary data 7 or in addition to ancillary data 7 as described above. In one embodiment, the transceiver 42 continues to communicate and the database 44 continues to store ancillary data 7 during subsequent playout, broadcast, distribution or performance of the content 1 as described above.

The storage location 40 may be a location accessible to the broadcaster 20 and the consumer 30, such as the cloud or a local archive with general accessibility (e.g., via a link as described above) that may be controlled by subscription, password, etc.

The system 10 may be implemented using software, hardware, analog or digital techniques.

Figure 6:
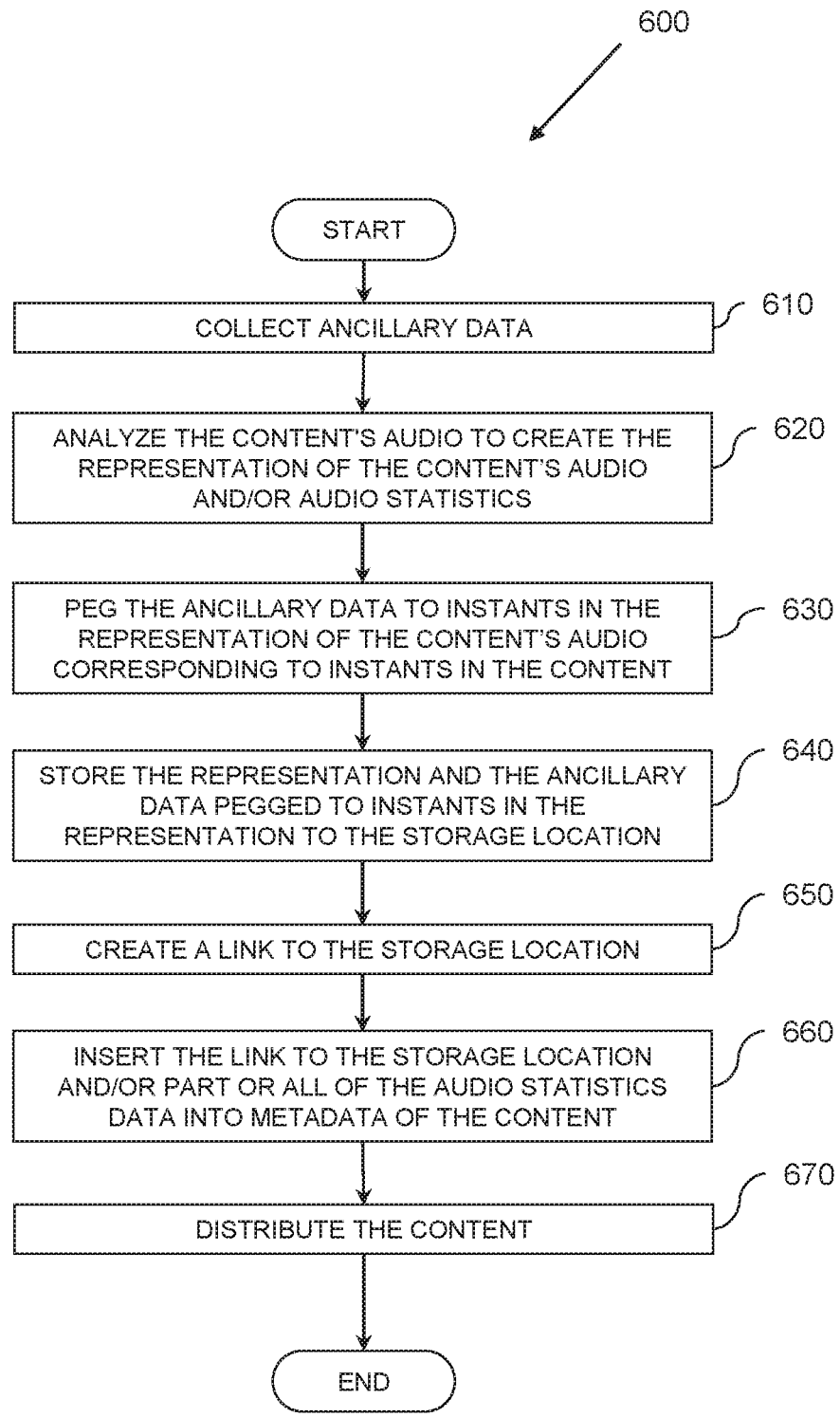
FIG. 6 illustrates a flow diagram for an exemplary method for synchronizing ancillary data to content including audio.
Figure 7:
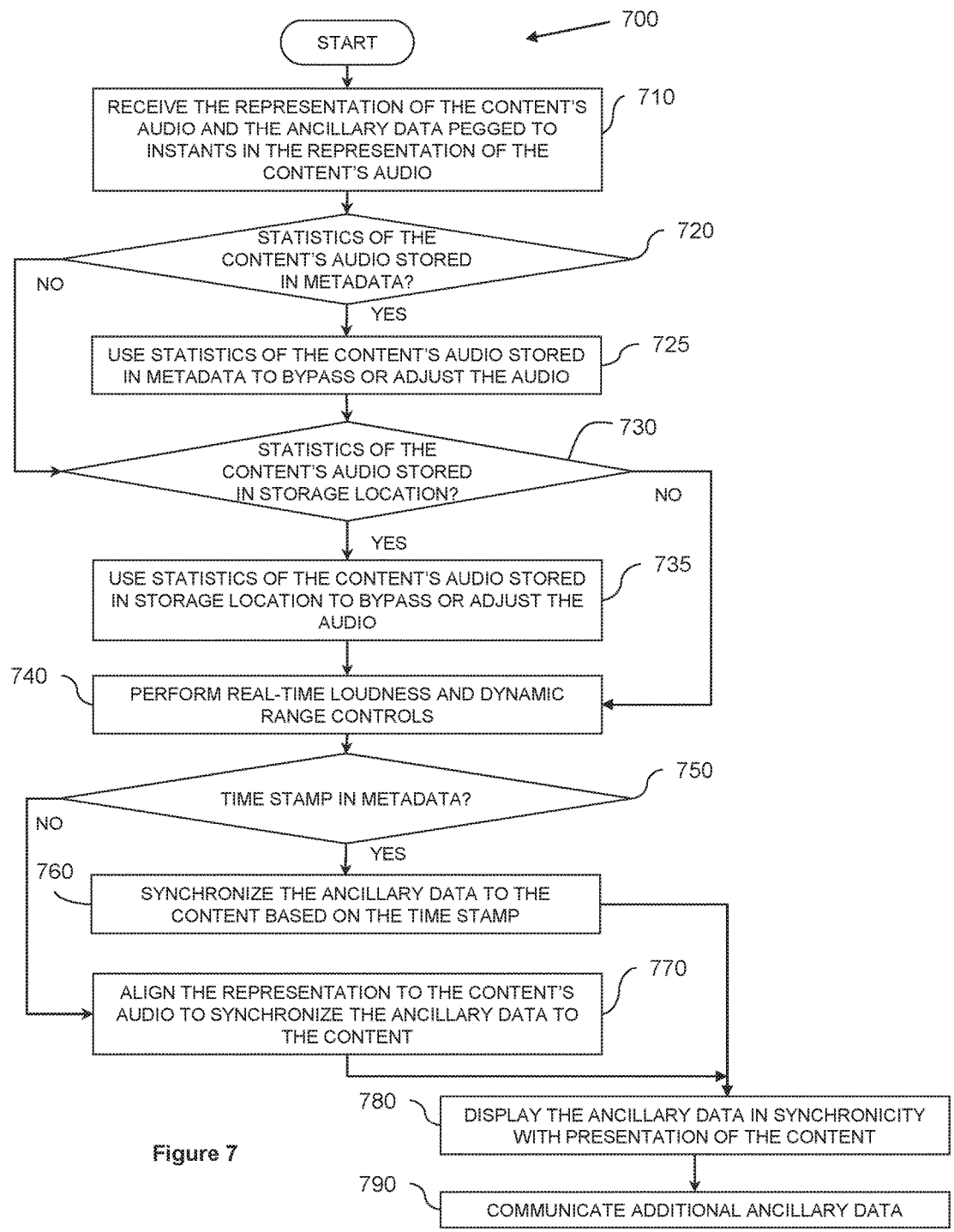
FIG. 7 illustrates a flow diagram for an exemplary method for synchronizing ancillary data to content including audio.

Exemplary methods may be better appreciated with reference to the flow diagrams of FIGS. 6 and 7. While for purposes of simplicity of explanation, the illustrated methodologies are shown and described as a series of blocks, it is to be appreciated that the methodologies are not limited by the order of the blocks, as some blocks can occur in different orders or concurrently with other blocks from that shown and described. Moreover, less than all the illustrated blocks may be required to implement an exemplary methodology. Furthermore, additional methodologies, alternative methodologies, or both can employ additional blocks, not illustrated.

In the flow diagrams, blocks denote "processing blocks" that may be implemented with logic. The processing blocks may represent a method step or an apparatus element for performing the method step. The flow diagrams do not depict syntax for any particular programming language, methodology, or style (e.g., procedural, object-oriented). Rather, the flow diagrams illustrates functional information one skilled in the art may employ to develop logic to perform the illustrated processing. It will be appreciated that in some examples, program elements like temporary variables, routine loops, and so on, are not shown. It will be further appreciated that electronic and software applications may involve dynamic and flexible processes so that the illustrated blocks can be performed in other sequences that are different from those shown or that blocks may be combined or separated into multiple components. It will be appreciated that the processes may be implemented using various programming approaches like machine language, procedural, object oriented or artificial intelligence techniques.

FIG. 6 illustrates a flow diagram for an exemplary method 600 for synchronizing ancillary data to content including audio.

The method 600 includes at 610 collecting the ancillary data 7. Collection may take place prior to, during or post playout, broadcast, distribution or performance of the content as described above. The ancillary data 7 is data that is somehow related to the content and may include data describing the content such as content name or content identification data, data about a script played out in the content, data about wardrobe wore by characters in the content, data including comments from performers, producers, or directors of the content, an Uniform Resource Locator (URL) to a resource that includes information about the content, data about music in the audio of the content, etc. Ancillary data 7 may include commercial data such as advertisement data. Ancillary data 7 may also include user data such as comments from viewers of the content (e.g., twitter messages, etc.) Ancillary data 7 may also include professional or technical data such as statistics of the content's audio including, for example, loudness or dynamic range scaling of the content's audio, etc.

At 620, the method 600 further includes analyzing the audio 5 of the content to create the representation 9 of the content's audio 5. The representation 9 may be created by creating an audio waveform signature of the content's audio as described above.

Creation of the representation 9 (e.g., an audio waveform signature) of the content's audio may be accomplished as part of analysis of the audio 5. The audio 5 for the content 1 may be analyzed and audio statistics collected on the same timeline. This can occur during a typical quality control or mastering session. Statistics that may be collected include content name or ID, the audio waveform signature, loudness and or dynamic range scaling to ensure content matches delivery specifications, and other content-specific non-real-time statistics.

At 630, the ancillary data 7 is pegged to instants in the representation 9 of the content's audio 5 corresponding to instants in the content 1. Pegging the ancillary data 7 to instants in the representation 9 means that the ancillary data 7 is time-aligned to the content 1. This pegging may be accomplished by associating the ancillary data 7 to a representation 9 of a specific content 1 and time stamping the ancillary data 7 with times of instants in the representation 9 or other time alignment methods.

At 640, the representation 9 and the ancillary data 7 pegged to instants in the representation 9 may be stored to the storage location 40.

At 650, a link to the storage location 40 is also created.

At 660, the link to the storage location 40 as well as part or all of the audio statistics data may be inserted into audio metadata (i.e., EMDF) for encoded or PCM+MD audio and/or the LFE channel for PCM-only audio. U.S. Pat. No. 8,380,334 issued on Feb. 19, 2013 incorporated here by reference discloses methods and systems for carrying auxiliary data within audio signals that may be used for inserting metadata into audio signals. Other systems and methods different from those disclosed in the '334 patent may also be used for inserting metadata into audio signals.

At 670, the content 1 is distributed. The content 1 may be delivered as it is today with audio that is encoded or baseband PCM, with or without metadata.

FIG. 7 illustrates a flow diagram for an exemplary method 700 for synchronizing ancillary data to content including audio.

At 710, the method 700 includes receiving the representation 9 of the content's audio 5 and the ancillary data 7 pegged to the instants in the representation 9. This combination of the representation 9 and the ancillary data 7 may be used in at least two contexts: 1) during playout for transmission and 2) upon reception of the content 1 at the consumer's premises.

During playout for transmission, an audio processor may accept encoded or baseband PCM audio of the content 1 with or without metadata and may also be connected to the cloud or other location where the storage location 40 resides. In this context, the method 700 may include using statistics of the content's audio to bypass or adjust an audio processor processing the content's audio.

At 720, if EMDF metadata is present or if metadata is detected within the LFE channel and statistics of the content's audio are stored in the metadata, at 725, the statistics of the content's audio 5 (e.g., loudness and other content-specific data) may be used to bypass or adjust the audio processor enabling content that is already correct to pass with minimal or no modification to maintain original quality and compliance.

At 730, if metadata or LFE data is not present or if statistics of the content's audio are not stored in the metadata, a real-time audio signature of the audio 5 may be compared to the representation 9 received from the storage location 40 to identify the content 1. If they match within a selectable range, the content 1 is identified and, at 735, the statistics of the content's audio 5 that may be stored at the storage location 40 may be used to bypass or adjust the audio processor enabling content that is already correct to pass with minimal or no modification to maintain original quality and compliance.

At 740, if a) metadata is not present or it does not include statistics of the content's audio 5 for a particular content or segment and b) the real-time audio signature of the audio 5 and the representation 9 do not match within a certain amount of time, real-time loudness and dynamic range controls may be performed to ensure that the audio 5 is compliant.

Upon reception of the content 1, the method 700 may include synchronizing the ancillary data 7 to the content 1. At 750, if metadata (e.g., EMDF) is present and it includes a time stamp, at 760, the ancillary data 7 may be synchronized to the content 1 based on the time stamp. If metadata is not present or it does not include the time stamp, at 770, the method 700 aligns the representation 9 to the content's audio 5 as described above to synchronize the ancillary data 7 to the content 1.

The consumer application or the interaction tools 38, now synchronized to the content 1 may, at 780, display the ancillary data 7 in synchronicity with presentation of the content 1 relying on the aligning of the representation 9 to the content's audio 5.

At 790, the method 700 may further communicate additional ancillary data 7 that may be viewed or accessed by other consumers, program producers, or possibly even advertisers. This data can also be used by downstream professional or consumer ad insertion mechanisms and owing to the detail-rich data that is present, potentially augmented by real-time updates or additions to that data, the insertions can be targeted with a much finer accuracy than previous static methods. The method 700 may continue to receive and store new ancillary data 7 during subsequent playout, broadcast, distribution, or performance of the content 1. The new ancillary data 7 is pegged to the instants in a representation 9 of the content's audio 5 corresponding to instants in the content 1 during the subsequent playout, broadcast, distribution, or performance.

While the figures illustrate various actions occurring in serial, it is to be appreciated that various actions illustrated could occur substantially in parallel, and while actions may be shown occurring in parallel, it is to be appreciated that these actions could occur substantially in series. While a number of processes are described in relation to the illustrated methods, it is to be appreciated that a greater or lesser number of processes could be employed and that lightweight processes, regular processes, threads, and other approaches could be employed. It is to be appreciated that other exemplary methods may, in some cases, also include actions that occur substantially in parallel. The illustrated exemplary methods and other embodiments may operate in real-time, faster than real-time in a software or hardware or hybrid software/hardware implementation, or slower than real time in a software or hardware or hybrid software/hardware implementation.

Figure 8:
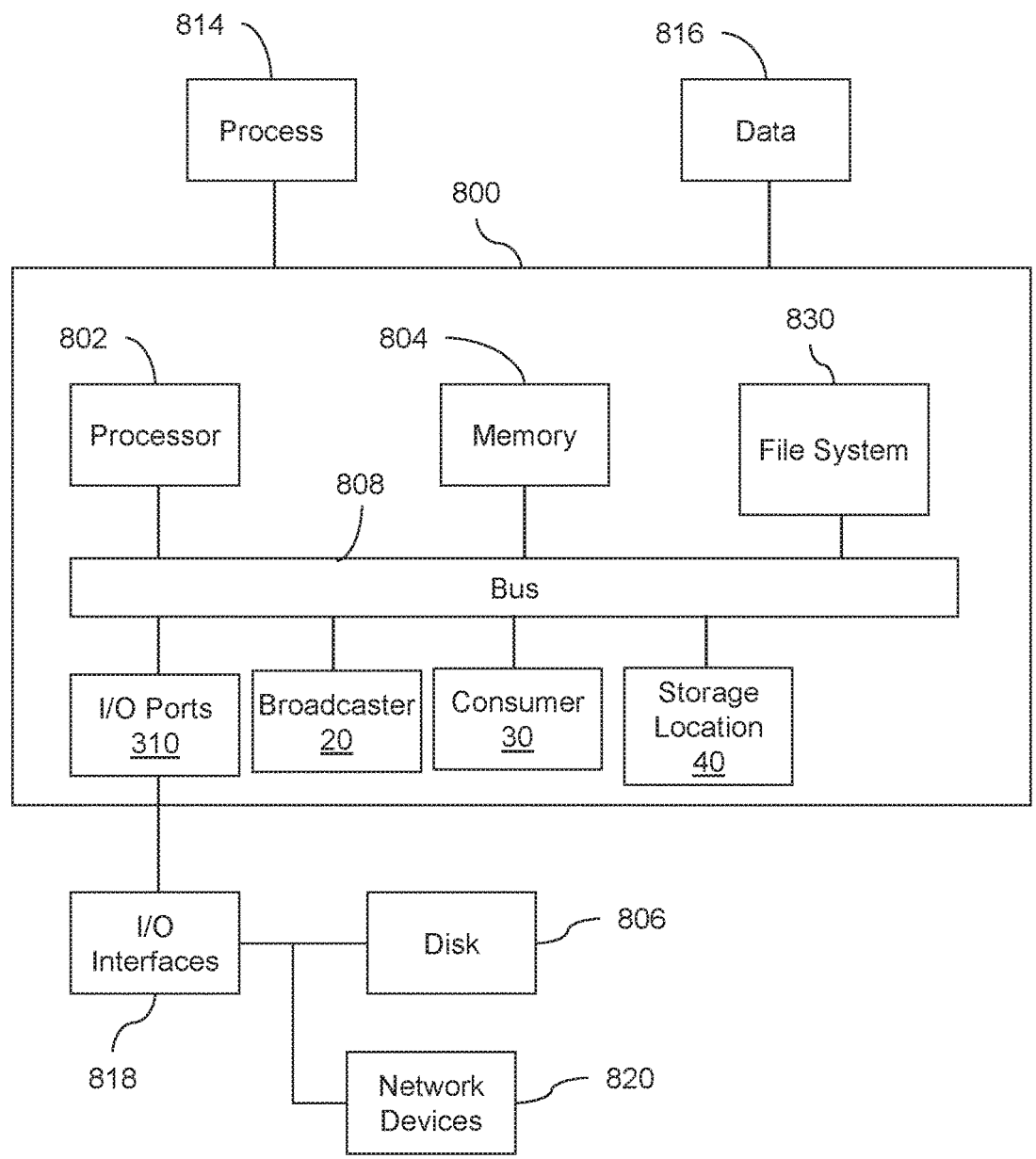
FIG. 8 illustrates a block diagram of an exemplary machine for synchronizing ancillary data to content including audio.

FIG. 8 illustrates a block diagram of an exemplary machine 800 for synchronizing ancillary data to content including audio. The machine 800 includes a processor 802, a memory 804, and I/O Ports 810 operably connected by a bus 808.

In one example, the machine 800 may receive input signals including the content 1, the video 3, the audio 5, the ancillary data 7, the representation 9, etc. via, for example, I/O Ports 810 or I/O Interfaces 818. The machine 800 may also include the pre-synchronizer 22, the transceiver 24, the audio processor 26, and the authoring tools 28 of the broadcaster 20. The machine 800 may also include the transceiver 32, the post-synchronizer 34, the audio processor 36, and the interaction tools 38 of the consumer 30. The machine 800 may also include the transceiver 42 and the database 44 of the storage location 40. Thus, the broadcaster 20, the consumer 30, or the storage location 40 may be implemented in machine 1700 as hardware, firmware, software, or a combination thereof and, thus, the machine 1700 and its components may provide means for performing functions described herein as performed by the pre-synchronizer 22, the transceiver 24, the audio processor 26, the authoring tools 28, the transceiver 32, the post-synchronizer 34, the audio processor 36, the interaction tools 38, the transceiver 42 and the database 44.

The processor 802 can be a variety of various processors including dual microprocessor and other multi-processor architectures. The memory 804 can include volatile memory or non-volatile memory. The non-volatile memory can include, but is not limited to, ROM, PROM, EPROM, EEPROM, and the like. Volatile memory can include, for example, RAM, synchronous RAM (SRAM), dynamic RAM (DRAM), synchronous DRAM (SDRAM), double data rate SDRAM (DDR SDRAM), and direct RAM bus RAM (DRRAM).

A disk 806 may be operably connected to the machine 800 via, for example, an I/O Interfaces (e.g., card, device) 818 and an I/O Ports 810. The disk 806 can include, but is not limited to, devices like a magnetic disk drive, a solid state disk drive, a floppy disk drive, a tape drive, a Zip drive, a flash memory card, or a memory stick. Furthermore, the disk 806 can include optical drives like a CD-ROM, a CD recordable drive (CD-R drive), a CD rewriteable drive (CD-RW drive), or a digital video ROM drive (DVD ROM). The memory 804 can store processes 814 or data 816, for example. The disk 806 or memory 804 can store an operating system that controls and allocates resources of the machine 800.

The bus 808 can be a single internal bus interconnect architecture or other bus or mesh architectures. While a single bus is illustrated, it is to be appreciated that machine 800 may communicate with various devices, logics, and peripherals using other busses that are not illustrated (e.g., PCIE, SATA, Infiniband, 1394, USB, Ethernet). The bus 808 can be of a variety of types including, but not limited to, a memory bus or memory controller, a peripheral bus or external bus, a crossbar switch, or a local bus. The local bus can be of varieties including, but not limited to, an industrial standard architecture (ISA) bus, a microchannel architecture (MCA) bus, an extended ISA (EISA) bus, a peripheral component interconnect (PCI) bus, a universal serial (USB) bus, and a small computer systems interface (SCSI) bus.

The machine 800 may interact with input/output devices via I/O Interfaces 818 and I/O Ports 810. Input/output devices can include, but are not limited to, a keyboard, a microphone, a pointing and selection device, cameras, video cards, displays, disk 806, network devices 820, and the like. The I/O Ports 810 can include but are not limited to, serial ports, parallel ports, and USB ports.

The machine 800 can operate in a network environment and thus may be connected to network devices 820 via the I/O Interfaces 818, or the I/O Ports 810. Through the network devices 820, the machine 800 may interact with a network. Through the network, the machine 800 may be logically connected to remote computers. The networks with which the machine 800 may interact include, but are not limited to, a local area network (LAN), a wide area network (WAN), and other networks. The network devices 820 can connect to LAN technologies including, but not limited to, fiber distributed data interface (FDDI), copper distributed data interface (CDDI), Ethernet (IEEE 802.3), token ring (IEEE 802.5), wireless computer communication (IEEE 802.11), Bluetooth (IEEE 802.15.1), Zigbee (IEEE 802.15.4) and the like. Similarly, the network devices 820 can connect to WAN technologies including, but not limited to, point to point links, circuit switching networks like integrated services digital networks (ISDN), packet switching networks, and digital subscriber lines (DSL). While individual network types are described, it is to be appreciated that communications via, over, or through a network may include combinations and mixtures of communications.

DEFINITIONS

The following includes definitions of selected terms employed herein. The definitions include various examples or forms of components that fall within the scope of a term and that may be used for implementation. The examples are not intended to be limiting. Both singular and plural forms of terms may be within the definitions.

"Content" corresponds to still images, segments of audio media, video media, or audio/visual (AV) media and include information that is embodied, stored, transmitted, received, processed, or otherwise used with at least one medium. Common media content formats include FLV format (flash video), Windows Media Video, RealMedia, Quicktime, MPEG, MP3, DivX, JPEGs, and Bitmaps. As used herein, the terms "media clips", "media content," "information content," and "content" may be used interchangeably.

"Data store" or "database," as used herein, refers to a physical or logical entity that can store data. A data store may be, for example, a database, a table, a file, a list, a queue, a heap, a memory, a register, and so on. A data store may reside in one logical or physical entity or may be distributed between two or more logical or physical entities.

"Logic," as used herein, includes but is not limited to hardware, firmware, software or combinations of each to perform a function(s) or an action(s), or to cause a function or action from another logic, method, or system. For example, based on a desired application or needs, logic may include a software controlled microprocessor, discrete logic like an application specific integrated circuit (ASIC), a programmed logic device, a memory device containing instructions, or the like. Logic may include one or more gates, combinations of gates, or other circuit components.

Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

An "operable connection," or a connection by which entities are "operably connected," is one in which signals, physical communications, or logical communications may be sent or received. Typically, an operable connection includes a physical interface, an electrical interface, or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic, software, or other entity. Logical or physical communication channels can be used to create an operable connection.

In broadcasting, "playout" is a term for the transmission of radio or TV channels from the broadcaster into broadcast networks that delivers the content to the audience.

"Signal," as used herein, includes but is not limited to one or more electrical or optical signals, analog or digital signals, data, one or more computer or processor instructions, messages, a bit or bit stream, or other means that can be received, transmitted, or detected.

"Software," as used herein, includes but is not limited to, one or more computer or processor instructions that can be read, interpreted, compiled, or executed and that cause a computer, processor, or other electronic device to perform functions, actions or behave in a desired manner. The instructions may be embodied in various forms like routines, algorithms, modules, methods, threads, or programs including separate applications or code from dynamically or statically linked libraries. Software may also be implemented in a variety of executable or loadable forms including, but not limited to, a stand-alone program, a function call (local or remote), a servlet, an applet, instructions stored in a memory, part of an operating system or other types of executable instructions. It will be appreciated by one of ordinary skill in the art that the form of software may depend, for example, on requirements of a desired application, the environment in which it runs, or the desires of a designer/programmer or the like. It will also be appreciated that computer-readable or executable instructions can be located in one logic or distributed between two or more communicating, co-operating, or parallel processing logics and thus can be loaded or executed in serial, parallel, massively parallel and other manners.

Suitable software for implementing the various components of the example systems and methods described herein may be produced using programming languages and tools like Java, Pascal, C#, C++, C, CGI, Perl, SQL, APIs, SDKs, assembly, firmware, microcode, or other languages and tools. Software, whether an entire system or a component of a system, may be embodied as an article of manufacture and maintained or provided as part of a computer-readable medium as defined previously. Another form of the software may include signals that transmit program code of the software to a recipient over a network or other communication medium. Thus, in one example, a computer-readable medium has a form of signals that represent the software/firmware as it is downloaded from a web server to a user. In another example, the computer-readable medium has a form of the software/firmware as it is maintained on the web server. Other forms may also be used.

"User" or "consumer," as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, displaying, or the like, refer to actions and processes of a computer system, logic, processor, or similar electronic device that manipulates and transforms data represented as physical (electronic) quantities.

For ease of explanation, the present disclosure describes examples in the context of the nomenclature described in ETSI TS 102 366 (Annex H) such as, for example, the Extensible Metadata Format (EMDF) used to carry information and control data about audio signals into which it is embedded. The principles of the present disclosure, however, are not limited to that context and may be practiced in various other contexts including any such embedded metadata schemes included with any compressed audio including ETSI TS 103 190 (section 4.3.15) or baseband PCM audio system including metadata as described in ATSC A52:2012 and A/85:2013 or even the SMPTE 337M standard.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

While example systems, methods, and so on, have been illustrated by describing examples, and while the examples have been described in considerable detail, it is not the intention of the applicants to restrict or in any way limit scope to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

What is claimed is:

1. A machine or group of machines for synchronizing ancillary data to content including audio, comprising:
   a pre-synchronizer configured to obtain the ancillary data and a representation of the content's audio and to peg the ancillary data to instants in the representation of the content's audio corresponding to instants in the content such that subsequent alignment of the representation of the content's audio to the content's audio synchronizes the ancillary data, pegged to the instants in the representation of the content's audio, to the content; and
   a transceiver configured to communicate the representation of the content's audio and the ancillary data pegged to the instants in the representation of the content's audio to a storage location,
   wherein the representation of the content's audio is an audio waveform signature of the content's audio.

2. The machine or group of machines of claim 1, wherein the pre-synchronizer is configured to receive ancillary data in the form of:
   data about music in the audio,
   data about a script played out in the content,
   data about wardrobe wore by characters in the content,
   data describing the content,
   data including comments from performers, producers, or directors of the content, data including comments from viewers of the content,
   data including a Uniform Resource Locator (URL) to a resource that includes information about the content,
   advertisement data, or
   statistics of the content's audio including at least one of:
   content name or content identification, and
   loudness or dynamic range scaling of the content's audio.

3. The machine or group of machines of claim 1, wherein:
   the transceiver is configured to communicate the representation of the content's audio and the ancillary data pegged to the instants in the representation of the content's audio to a database accessible by consumers of the content.

4. The machine or group of machines of claim 1, wherein:
   the transceiver is configured to communicate the representation of the content's audio and the ancillary data pegged to the instants in the representation of the content's audio to a storage location accessible by consumers of the content; and
   the pre-synchronizer is configured to create a link to the storage location.

5. The machine or group of machines of claim 1, comprising:
   an audio processor configured to create the representation of the content's audio,
   wherein:
   the transceiver is configured to communicate the representation of the content's audio and the ancillary data pegged to the instants in the representation of the content's audio to a storage location accessible by consumers of the content;
   the pre-synchronizer is configured to create a link to the storage location; and
   the audio processor is configured to insert the link to the storage location into metadata of the content's audio.

6. The machine or group of machines of claim 1, comprising:
   an audio processor configured to analyze the content's audio to collect statistics of the content's audio including at least one of loudness or dynamic range scaling of the content's audio, wherein:
   the transceiver is configured to communicate the representation of the content's audio and the ancillary data pegged to the instants in the representation of the content's audio to a storage location accessible by consumers of the content;
   the pre-synchronizer is configured to create a link to the storage location; and
   the audio processor is configured to insert the link to the storage location and the statistics of the content's audio into metadata of the content's audio.

7. The machine or group of machines of claim 1, comprising:
   an audio processor configured to analyze the content's audio to collect statistics of the content's audio including at least one of loudness or dynamic range scaling of the content's audio, wherein:
   the transceiver is configured to communicate the representation of the content's audio and the ancillary data pegged to the instants in the representation of the content's audio to a storage location accessible by consumers of the content; and
   the audio processor is configured to insert the statistics of the content's audio into metadata of the content's audio.

8. The machine or group of machines of claim 1, comprising:
   an audio processor configured to analyze the content's audio to collect statistics of the content's audio including at least one of loudness or dynamic range scaling of the content's audio, wherein:
   the transceiver is configured to communicate the representation of the content's audio, the statistics of the content's audio and the ancillary data pegged to the instants in the representation of the content's audio to a storage location accessible by consumers of the content.

9. The machine or group of machines of claim 1, wherein:
   the pre-synchronizer is configured to collect the ancillary data during a previous playout or performance of the content and to peg the ancillary data to instants in the representation of the content's audio corresponding to instants in the content's audio.

10. The machine or group of machines of claim 1, comprising:
    an audio processor configured to create the representation of the content's audio and transmit the representation of the content's audio to the pre-synchronizer.

11. The machine or group of machines of claim 1, comprising:
    an audio processor configured to create the representation of the content's audio by creating an audio waveform signature of the content's audio.

12. The machine or group of machines of claim 1, comprising:
    authoring tools configured to collect the ancillary data during a playout or performance of the content for pegging the ancillary data to the instants in the representation of the content's audio corresponding to instants in the content's audio.

13. A machine or group of machines for synchronizing ancillary data to content including audio, comprising:
- a transceiver configured to obtain the content, a representation of the content's audio that is an audio waveform signature of the content's audio and ancillary data pegged to instants in the representation of the content's audio corresponding to instants in the content; and
- a post-synchronizer configured to align the representation of the content's audio to the content's audio thereby synchronizing the ancillary data pegged to the instants in the representation of the content's audio to the content.

14. The machine or group of machines of claim 13, wherein the transceiver is configured to receive the ancillary data in the form of:
- data about music in the audio,
- data about a script played out in the content,
- data about wardrobe wore by characters in the content,
- data describing the content,
- data including comments from performers, producers, or directors of the content, data including comments from viewers of the content,
- data including a Uniform Resource Locator (URL) to a resource that includes information about the content,
- advertisement data, or
- statistics of the content's audio including at least one of: content name or content identification, and loudness or dynamic range scaling of the content's audio.

15. The machine or group of machines of claim 13, comprising:
- interaction tools configured to collect the ancillary data during a playout or performance of the content for pegging the ancillary data to the instants in the representation of the content's audio corresponding to instants in the content's audio.

16. The machine or group of machines of claim 13, comprising:
- an audio processor configured to receive the content's audio from the transceiver and extract from metadata of the content's audio a link to storage location in which the representation of the content's audio and the ancillary data pegged to the instants in the representation of the content's audio are stored and accessible by consumers of the content; and
- the transceiver is configured to obtain the representation of the content's audio and the ancillary data pegged to the instants in the representation of the content's audio from the storage location.

17. The machine or group of machines of claim 13, comprising:
- an audio processor configured to receive the content's audio from the transceiver and extract from metadata of the content's audio a) a link to storage location in which the representation of the content's audio and the ancillary data pegged to the instants in the representation of the content's audio are stored accessible by consumers of the content and b) statistics of the content's audio; and
- the transceiver is configured to obtain the representation of the content's audio and the ancillary data pegged to the instants in the representation of the content's audio from the storage location.

18. The machine or group of machines of claim 13, comprising:
- an audio processor configured to a) receive the content's audio from the transceiver and extract from metadata of the content statistics of the content's audio including at least one of loudness or dynamic range scaling of the content's audio and b) process the content's audio based on the statistics of the content's audio.

19. The machine or group of machines of claim 13, comprising:
- an audio processor configured to receive the content's audio from the transceiver;
- wherein
- the transceiver is configured to obtain from a storage location the representation of the content's audio, the ancillary data pegged to the instants in the representation of the content's audio from a storage location accessible by consumers of the content, and statistics of the content's audio including at least one of loudness or dynamic range scaling of the content's audio, and
- the audio processor is configured to process the content's audio based on the statistics of the content's audio.

20. The machine or group of machines of claim 13, comprising:
- an audio processor configured to compare the content's audio to the representation of the content's audio to identify the content.

21. The machine or group of machines of claim 13, comprising: an audio processor configured to,
- when the content's audio includes metadata, using statistics of the content's audio including at least one of loudness or dynamic range scaling of the content's audio stored in the metadata to process the content's audio, and
- when the content's audio does not include metadata, using statistics of the content's audio including at least one of loudness or dynamic range scaling of the content's audio stored with the ancillary data to process the content's audio.

22. The machine or group of machines of claim 13, comprising:
- an audio processor configured to process the content's audio using statistics of the content's audio including at least one of loudness or dynamic range scaling of the content's audio stored with the ancillary data.

23. The machine or group of machines of claim 13, comprising: interaction tools configured to display the ancillary data in synchronicity with presentation of the content relying on the aligning of the representation of the content's audio to the content's audio to synchronize the ancillary data pegged to the instants in the representation of the content's audio to the content's audio.

24. A machine or group of machines for synchronizing ancillary data to content including audio, comprising:
- a database configured to store a representation of the content's audio that is an audio waveform signature of the content's audio and ancillary data pegged to instants in the representation of the content's audio such that subsequent alignment of the representation of the content's audio to the content's audio synchronizes the ancillary data pegged to the instants in the representation of the content's audio to the content; and
- a transceiver configured to communicate the representation of the content's audio and the ancillary data pegged to the instants in the representation of the content's audio.

25. The machine or group of machines of claim 24, wherein
- the database is configured to store statistics of the content's audio including at least one of loudness or dynamic range scaling of the content's audio.

26. The machine or group of machines of claim 24, wherein
the database is configured to continue to receive and store the ancillary data during subsequent playout or performance of the content, wherein the ancillary data is pegged to the instants in the representation of the content's audio corresponding to instants in the content's audio during the subsequent playout or performance.

27. A method to synchronize ancillary data to content including audio, the method comprising:
obtaining a representation of the content's audio that is an audio waveform signature of the content's audio and ancillary data pegged to instants in the representation of the content's audio; and
communicating the representation of the content's audio and the ancillary data pegged to the instants in the representation of the content's audio such that subsequent alignment of the representation of the content's audio to the content's audio synchronizes the ancillary data pegged to the instants in the representation of the content's audio to the content.

28. The method of claim 27, comprising at least one of collecting, storing, retrieving or displaying the ancillary data, the ancillary data including:
data about music in the audio,
data about a script played out in the content,
data about wardrobe wore by characters in the content,
data describing the content,
data including comments from performers, producers, or directors of the content, data including comments from viewers of the content,
data including a Uniform Resource Locator (URL) to a resource that includes information about the content, advertisement data, or
statistics of the content's audio including at least one of: content name or content identification, and
loudness or dynamic range scaling of the content's audio.

29. The method of claim 27, comprising:
pegging the ancillary data to the instants in the representation of the content's audio; and
storing the representation of the content's audio and the ancillary data pegged to the instants in the representation of the content's audio to a database.

30. The method of claim 27, comprising:
collecting the ancillary data during a playout or performance of the content, wherein the representation of the content's audio is derived during the playout or performance from the content's audio and wherein the ancillary data is pegged to the instants in the representation of the content's audio corresponding to instants in the content's audio during the playout or performance.

31. The method of claim 27, comprising:
creating the representation of the content's audio by creating an audio waveform signature of the content's audio; and
storing the representation of the content's audio and the ancillarydata pegged to the instants in the representation of the content's audio.

32. The method of claim 27, comprising:
creating the representation of the content's audio and pegging the ancillary data to the instants in the representation of the content's audio;
storing the representation of the content's audio and the ancillary data pegged to the instants in the representation of the content's audio to a storage location; and
creating a link to the storage location.

33. The method of claim 27, comprising:
storing the representation of the content's audio and the ancillary data pegged to the instants in the representation of the content's audio to a storage location;
creating a link to the storage location; and
inserting the link to the storage location into metadata of the content's audio.

34. The method of claim 27, comprising:
analyzing the content's audio to collect statistics of the content's audio including at least one of loudness or dynamic range scaling of the content's audio;
storing the representation of the content's audio and the ancillary data pegged to the instants in the representation of the content's audio to a storage location;
creating a link to the storage location; and
inserting the link to the storage location and the statistics of the content's audio into metadata of the content's audio.

35. The method of claim 27, comprising:
comparing the content's audio to the representation of the content's audio to identify the content.

36. The method of claim 27, comprising:
analyzing the content's audio to collect statistics of the content's audio including at least one of loudness or dynamic range scaling of the content's audio;
storing the representation of the content's audio and the ancillary data pegged to the instants in the representation of the content's audio to a storage location;
inserting the statistics of the content's audio into metadata of the content's audio.

37. The method of claim 27, comprising:
analyzing the content's audio to collect statistics of the content's audio including at least one of loudness or dynamic range scaling of the content's audio; and
storing the representation of the content's audio, the statistics of the content's audio and the ancillary data pegged to the instants in the representation of the content's audio to a storage location.

38. The method of claim 27, comprising:
when the content's audio includes metadata, using statistics of the content's audio stored in the metadata to bypass or adjust an audio processor processing the content's audio, and
when the content's audio does not include metadata, comparing the content's audio to the representation of the content's audio to identify the content and using statistics of the content's audio stored with the ancillary data to bypass or adjust the audio processor processing the content's audio.

39. The method of claim 27, comprising:
using statistics of the content's audio stored with the ancillary data to bypass or adjust the audio processor processing the content's audio.

40. The method of claim 27, comprising:
displaying the ancillary data in synchronicity with presentation of the content relying on the aligning of the representation of the content's audio to the content's audio to synchronize the ancillary data pegged to the instants in the representation of the content's audio to the content's audio.

* * * * *